United States Patent [19]
DiGiacomo et al.

[11] Patent Number: 6,015,197
[45] Date of Patent: Jan. 18, 2000

[54] PROTECTIVE GROMMET APPARATUS AND METHOD

[75] Inventors: Joseph DiGiacomo, Burbank; Daniel J. Lecinski; Kenneth S. Laughlin, both of Arlington Heights; Susan I. English, Chicago, all of Ill.

[73] Assignee: 3Com Corp., Rolling Meadows, Ill.

[21] Appl. No.: 09/032,686

[22] Filed: Feb. 28, 1998

[51] Int. Cl.[7] .................................................. A47B 67/00
[52] U.S. Cl. ..................................... 312/223.6; 174/65 G; 174/152 G; 16/2.1; 220/239; 52/220.8
[58] Field of Search ............................... 174/65 R, 65 G, 174/152 G, 153 G; 312/223.6, 223.1, 1, 4; 108/50.01; 16/2.1, 2.2; 160/116, 180, 354; 52/220.8; 220/239

[56] References Cited

U.S. PATENT DOCUMENTS

| | | | |
|---|---|---|---|
| 851,552 | 4/1907 | Nicolay | 174/153 G |
| 1,191,192 | 7/1916 | Klein | 174/153 G |
| 1,467,109 | 9/1923 | Holkenbrink | 174/153 G |
| 2,807,850 | 10/1957 | Davidson | 16/2.2 |
| 2,846,246 | 8/1958 | Peras | 174/152 G |
| 3,226,096 | 12/1965 | Ranson | 220/239 |
| 3,315,402 | 4/1967 | Scott et al. | 220/239 |
| 3,516,111 | 6/1970 | Heyman | 16/2.1 |
| 3,523,156 | 8/1970 | Phillips, Jr. | 174/65 G |
| 3,571,779 | 3/1971 | Collier . | |
| 3,675,810 | 7/1972 | Ross, Jr. et al. | 312/1 |
| 3,873,757 | 3/1975 | Berke et al. . | |
| 3,989,338 | 11/1976 | Gosser . | |
| 4,796,159 | 1/1989 | Miksche . | |
| 4,932,454 | 6/1990 | Swope | 160/116 |
| 5,198,617 | 3/1993 | Ozeki et al. . | |
| 5,272,988 | 12/1993 | Kelley et al. | 108/50.02 |
| 5,451,101 | 9/1995 | Ellison et al. | 312/223.6 |
| 5,533,917 | 7/1996 | Schmitz . | |

FOREIGN PATENT DOCUMENTS

| 2720936 | 11/1978 | Germany | 174/65 R |
|---|---|---|---|

OTHER PUBLICATIONS

IBM Technical Disclosure Bulletin, vol. 16, No. 7, Dec. 1973.

*Primary Examiner*—Peter M. Cuomo
*Assistant Examiner*—Gerald A. Anderson
*Attorney, Agent, or Firm*—Baniak Nicholas Pine & Gannon

[57] ABSTRACT

An apparatus and method for covering an opening in a cabinet for housing electronic devices includes a grommet for covering the opening in the cabinet. A plurality of slits are formed in the grommet defining a plurality of flexible tab portions to allow one or more cables to pass through the grommet. The plurality of slits include at least one longitudinally oriented slit and a plurality of transversely oriented slits which intersect the longitudinally oriented slit.

11 Claims, 3 Drawing Sheets

PROTECTIVE GROMMET APPARATUS AND METHOD

FIELD OF THE INVENTION

This invention relates generally to the field of protective covers for an electronics cabinet, and in particular, to a flexible protective grommet for covering an opening formed in an electronics cabinet and for providing strain relief for cables that pass through the grommet.

BACKGROUND OF THE INVENTION

Electronic devices, such as network access servers, are typically housed in a metal cabinet in a vertically stacked configuration. Cable troughs are typically mounted inside the cabinet to rout the various cables associated with the devices. An opening is typically formed in the top surface of the cabinet to allow cables to be routed in and out of the cabinet. However, when an installer positioned on top of the cabinet routs cables from the outside of the cabinet to the inside of the cabinet, there is nothing to prevent unwanted foreign objects, such as keys, pens, etc. from falling through the opening and into the cable trough mounted within the cabinet. Moreover, the cables can become frayed when they are pulled through the opening due to the contact between the cable and the metal edge surrounding the opening.

Accordingly, it would be desirable to have a protective grommet apparatus that overcomes the disadvantages described above, and to provide a simple and cost effective protective grommet apparatus.

SUMMARY OF THE INVENTION

One aspect of the invention provides a protective grommet apparatus for covering an opening in a cabinet for housing electronic devices. A grommet for covering the opening in the cabinet is provided. A plurality of slits are formed in the grommet defining a plurality of flexible tab portions to allow one or more cables to pass through the grommet. A plurality of openings may be formed in the grommet for securing the grommet to a surface of the cabinet. The plurality of slits may include at least one longitudinally oriented slit and a plurality of transversely oriented slits. The transversely oriented slits may intersect the longitudinally oriented slit. The transversely oriented slits may be substantially perpendicular to the longitudinally oriented slit. The grommet may be substantially rectangular in shape and may be formed from a single piece of flexible, insulative material. The flexible, insulative material may be rubber.

Another aspect of the invention provides a protective grommet apparatus for covering an opening in a cabinet for housing electronic devices.

The cabinet includes an outer wall. A cabinet opening is formed in the outer wall. A grommet is secured to the outer wall of the cabinet and covers the cabinet opening. A plurality of slits is formed in the grommet defining a plurality of flexible tab portions to allow one or more cables to pass through the grommet. A plurality of openings may be formed in the grommet for securing the grommet to the surface of the cabinet. The outer wall of the cabinet may be the top wall. The grommet may be formed from a single piece of flexible, insulative material. The flexible, insulative material may be rubber.

Another aspect of the invention provides a method for covering an opening in a cabinet for housing electronic devices. A grommet is provided. A plurality of slits is formed in the grommet defining a plurality of flexible tab portions to allow one or more cables to pass through the grommet. The grommet is secured to an outer wall of the cabinet. A plurality of openings may be formed in the grommet for securing the grommet to the outer wall of the cabinet.

Another aspect of the invention provides a method for covering an opening in a cabinet for housing electronic devices. The cabinet including an outer wall is provided. A cabinet opening is formed in the outer wall. A grommet is secured to the outer wall of the cabinet and covers the cabinet opening. A plurality of slits is formed in the grommet defining a plurality of flexible tab portions to allow one or more cables to pass through the grommet. At least one of the plurality of flexible tab portions is deflected. The cabinet opening is accessed to allow for the passage of the one or more cables. A plurality of openings may be formed in the grommet for securing the grommet to the outer wall of the cabinet. The cables may be data communication cables.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which are defined by the appended claims and equivalents thereof.

DETAILED DESCRIPTION OF THE DRAWINGS

DETAILED DESCRIPTION OF THE PRESENTLY PREFERRED EMBODIMENTS

Figure 1:
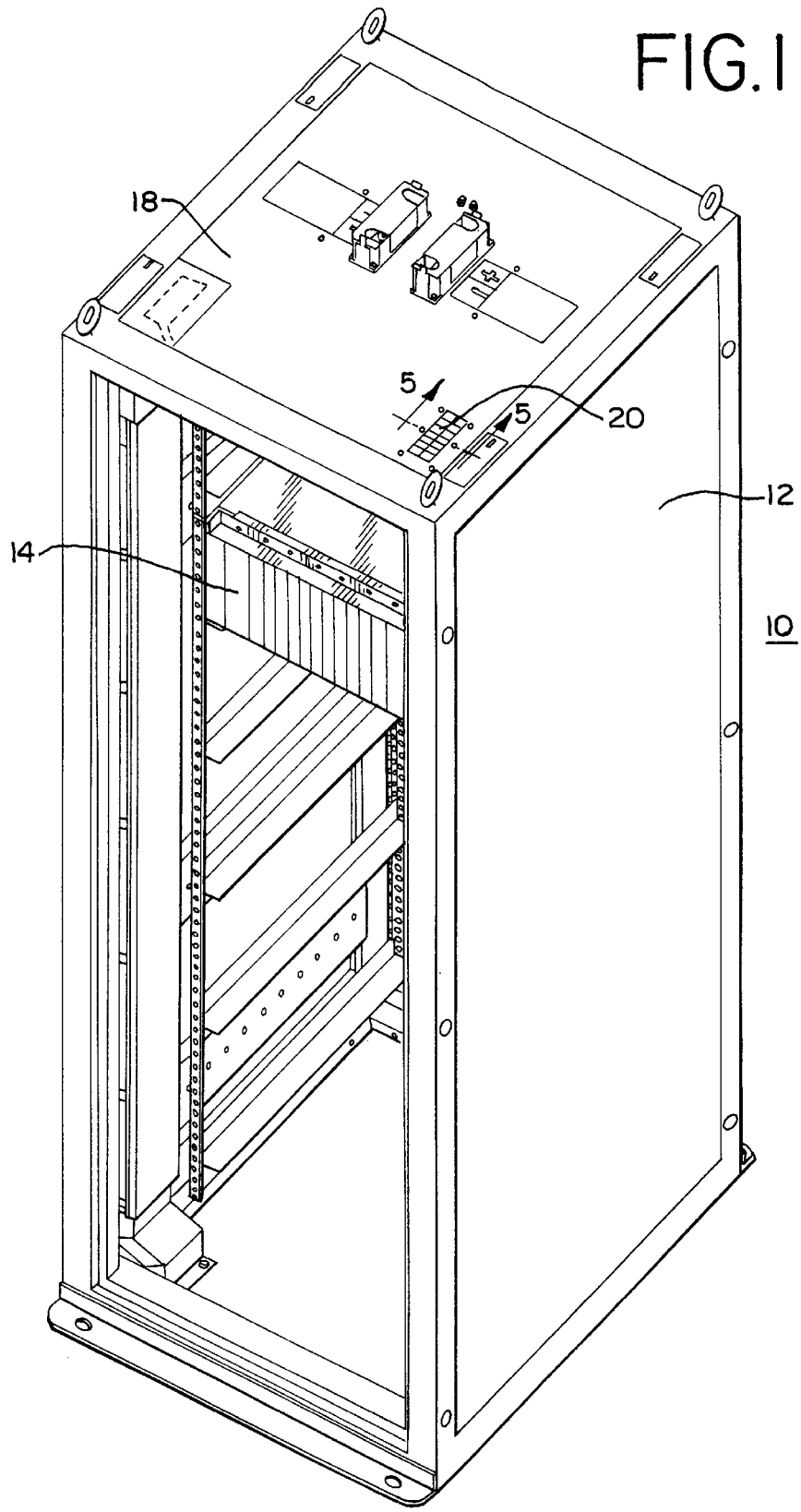
FIG. 1 is a perspective view of a preferred embodiment of a protective grommet apparatus which is made in accordance with the invention.
Figure 2:
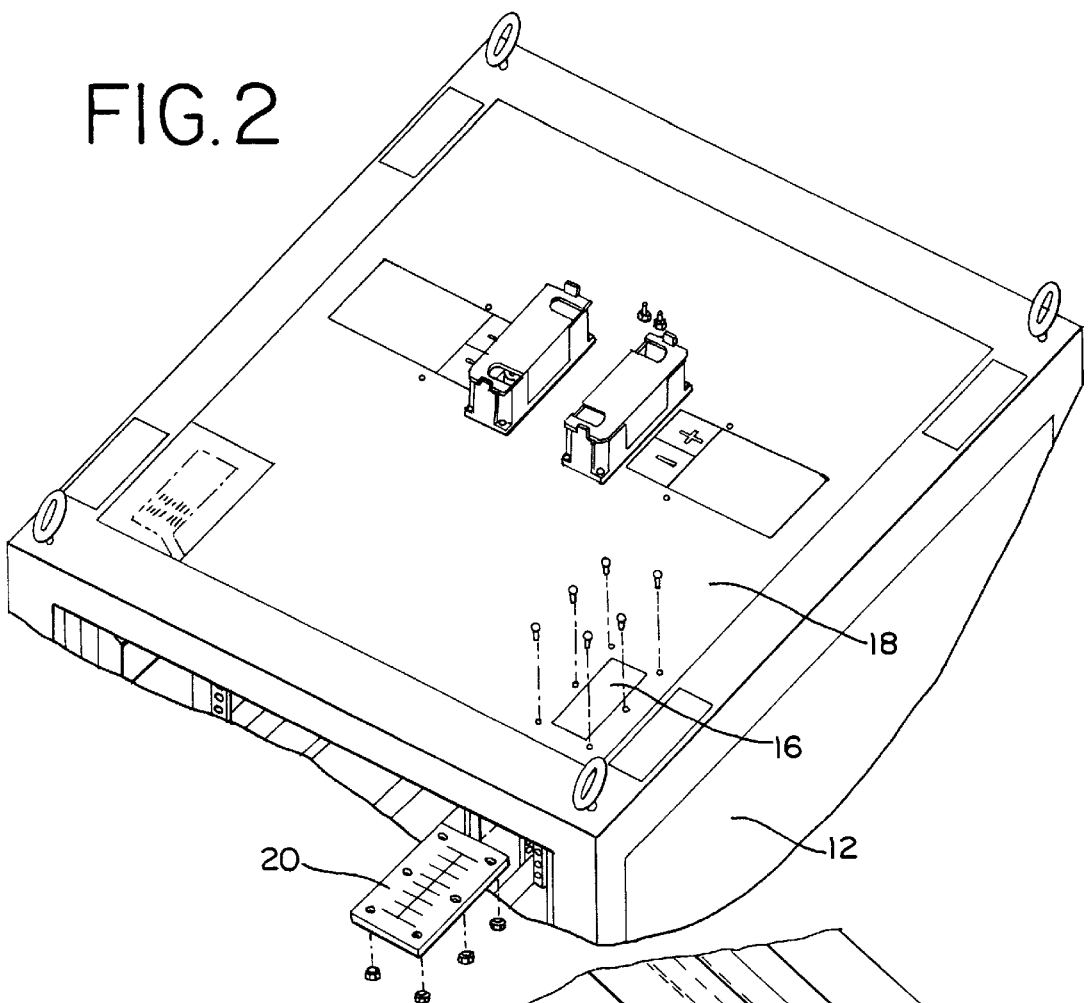
FIG. 2 is an exploded view of the grommet of the embodiment of FIG. 1
Figure 3:
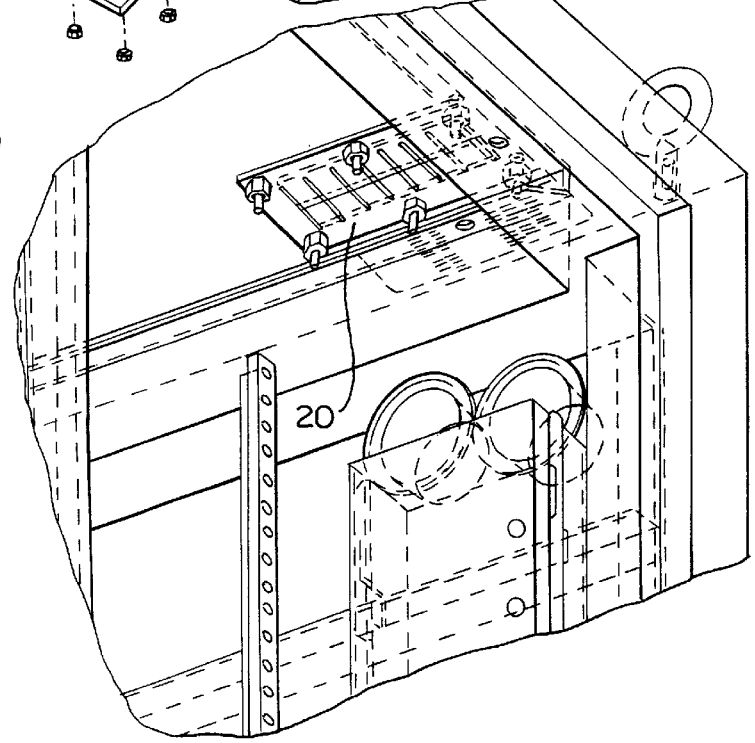
FIG. 3 is a perspective view of the grommet of FIG. 2 mounted to a cabinet.

As shown in FIG. 1, a preferred embodiment of a protective grommet apparatus 10 includes a cabinet 12 for housing electronic devices 14. The cabinet 12 may be any of the commercially available cabinets used for housing electronic devices. As shown in FIG. 2, the cabinet 12 includes an opening 16 formed in an outer wall 18 of the cabinet 12. In the embodiment shown, the outer wall 18 may be the top wall of the cabinet 12. A grommet 20 covers the opening 16 in the cabinet 12.

Figure 4:
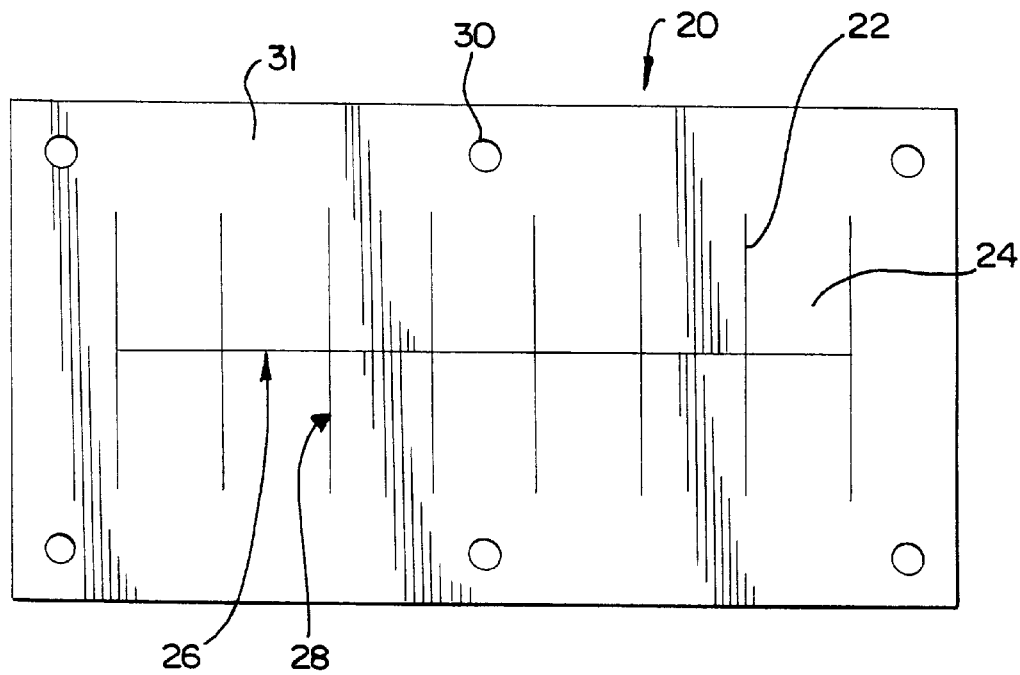
FIG. 4 is a plan view of the grommet of FIG. 3.
Figure 5:
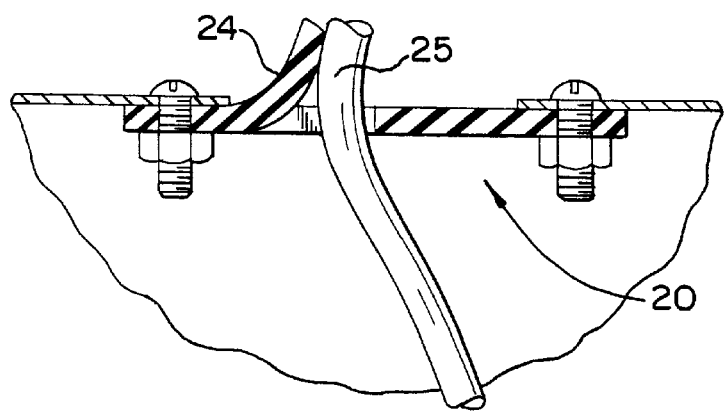
FIG. 5 is a sectional view taken along line 5—5 of FIG. 1.

Referring to FIGS. 4–5, the grommet 20 includes a plurality of slits 22 which define a plurality flexible tab portions 24 to allow one or more cables 25 to pass through the grommet 20. The cables 25 may include data communications or other types of cables associated with the electronic devices 14. The plurality of slits 22 may preferably include at least one longitudinally oriented slit 26 and a plurality of transversely oriented slits 28. In the embodiment shown, the transversely oriented slits 28 intersect the longitudinally oriented slit 26 and are substantially perpendicular to the longitudinally oriented slit 26. The tab portions 24 are generally rectangular in shape as defined by the plurality of slits 22.

The number slits 22 may vary depending on the sizes of the grommet 20 and the number of cables 25 that are required to pass through the grommet 20 and the opening 16. The orientation of the slits 22 may also vary depending on the particular application and the desired shape of the tab portions 24.

Referring to FIG. 4, the grommet 20 may preferably include a plurality of openings 30 for securing the grommet 20 to the top wall 18 of the cabinet 12. In the embodiment shown, the openings 30 are spaced along the outer perimeter 31 of the grommet 20. The grommet 20 may be secured to the top wall 18 of the cabinet 12 with any conventional means, such as screws, bolts or rivets. Alternatively, the grommet 20 may be fastened to the top wall 18 with any suitable adhesive material. The shape of the grommet 20 may vary depending on the shape of the opening 16 to be covered. In the embodiment shown, the grommet 20 is substantially rectangular in shape. The grommet 20 may be formed from a single piece of flexible, insulative material such as rubber. The grommet 20 may preferably be formed from Poron™, such as that supplied by Rogers Corporation. The tab portions 24 of the grommet 20 should be rigid enough to prevent foreign objects such as, for example, keys and pens, from passing through the grommet 20, but should be flexible enough to allow a cable 25 to be manually inserted through the grommet 20.

The grommet 20 shown in FIGS. 1–5 is used for covering an opening 16 in a cabinet 12 for housing electronic devices 14. The grommet 20 is secured to the top wall 18 of the cabinet 12 thereby covering the opening 16 in the cabinet 12. At least one of the plurality of tab portions 24 is deflected either up or down to provide access to the cabinet opening 16. This allows for the passage of one or more cables 25 through the grommet 20, through the cabinet opening 16, and into (or out of) the cabinet 12. One advantage of this invention is that the grommet 20 automatically adjusts to the number of cables being routed. In particular, the plurality of flexible tab portions 24 will adjust to the number of cables 25 passed through the opening 16 of the cabinet 12 to prevent foreign objects from falling into the cabinet 12. Moreover, the grommet 20 provides strain relief to the cables 25 that are routed into the cabinet 12 and prevents fraying of the cables 25 as they are pulled through opening 16 of the cabinet 12.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. A protective grommet apparatus for covering an opening in a cabinet for housing electronic devices comprising:
   a flexible grommet for covering the opening in the cabinet, a plurality of slits formed in the grommet, the plurality of slits including one longitudinally oriented slit and a plurality of transversely oriented slits, the transversely oriented slits intersecting the longitudinally oriented slit, the transversely oriented slits oriented substantially perpendicular to the longitudinally oriented slit, the plurality of slits defining a plurality of flexible tab portions arranged in two rows to allow one or more cables to pass through the grommet.

2. The apparatus of claim 1 further comprising a plurality of openings formed in the grommet for securing the grommet to a top wall of the cabinet.

3. The apparatus of claim 1 wherein the grommet is substantially rectangular in shape.

4. The apparatus of claim 1 wherein the grommet is formed from a single piece of insulative material.

5. The apparatus of claim 1 wherein the insulative material is rubber.

6. An apparatus for covering an opening in a cabinet for housing electronic devices comprising:
   the cabinet including a top wall, a cabinet opening formed in the top wall, a flexible grommet secured to the top wall of the cabinet and covering the cabinet opening, a plurality of slits formed in the grommet, the plurality of slits including one longitudinally oriented slit and a plurality of transversely oriented slits, the transversely oriented slits intersecting the longitudinally oriented slit, the transversely oriented slits oriented substantially perpendicular to the longitudinally oriented slit, the plurality of slits defining a plurality of flexible tab portions arranged in two rows to allow one or more cables to pass through the grommet.

7. The apparatus of claim 6 further comprising a plurality of openings formed in the grommet for securing the grommet to the top wall of the cabinet.

8. The apparatus of claim 6 wherein the grommet is formed from a single piece of insulative material.

9. The apparatus of claim 8 wherein the insulative material is rubber.

10. A method for covering an opening in a cabinet for housing electronic devices comprising:
    providing a flexible grommet, a plurality of openings formed in the grommet, a plurality of slits formed in the grommet, the plurality of slits including one longitudinally oriented slit and a plurality of transversely oriented slits, the transversely oriented slits intersecting the longitudinally oriented slit, the transversely oriented slits oriented substantially perpendicular to the longitudinally oriented slit, the plurality of slits defining a plurality of flexible tab portions arranged in two rows to allow one or more cables to pass through the grommet; and
    securing the grommet to a top wall of the cabinet.

11. A method for covering an opening in a cabinet for housing electronic devices comprising:
    providing the cabinet including a top wall, a cabinet opening formed in the top wall, a grommet secured to the top wall of the cabinet and covering the cabinet opening, a plurality of slits formed in the grommet, the plurality of slits including one longitudinally oriented slit and a plurality of transversely oriented slits, the transversely oriented slits intersecting the longitudinally oriented slit, the transversely oriented slits oriented substantially perpendicular to the longitudinally oriented slit, the plurality of slits defining a plurality of flexible tab portions arranged in two rows to allow one or more cables to pass through the grommet;
    deflecting at least one of the plurality of flexible tab portions; and
    accessing the cabinet opening to allow for the passage of the one or more cables into the cabinet.

* * * * *